United States Patent [19]
Lealman et al.

[11] Patent Number: 5,985,685
[45] Date of Patent: Nov. 16, 1999

[54] METHOD FOR MAKING OPTICAL DEVICE WITH COMPOSITE PASSIVE AND TAPERED ACTIVE WAVEGUIDE REGIONS

[75] Inventors: Ian F. Lealman; Michael J. Robertson; Simon D. Perrin, all of Ipswich, United Kingdom

[73] Assignee: British Telecommunications public limited company, London, United Kingdom

[21] Appl. No.: 09/161,714

[22] Filed: Sep. 29, 1998

Related U.S. Application Data

[62] Division of application No. 08/700,925, Aug. 23, 1996, Pat. No. 5,844,929, which is a continuation of application No. PCT/GB95/00387, Feb. 24, 1995, which is a continuation-in-part of application No. 08/252,006, May 31, 1994.

[30] Foreign Application Priority Data

Feb. 24, 1994 [EP] European Pat. Off. ............. 94301309

[51] Int. Cl.$^6$ ....................................................... H01S 3/05
[52] U.S. Cl. ................... 438/31; 438/29; 438/39; 438/46; 372/45; 385/28; 385/49
[58] Field of Search .................. 438/22, 29, 31, 438/39, 46, 47; 372/45, 50; 385/27, 28, 43, 49

[56] References Cited

U.S. PATENT DOCUMENTS

| | | |
|---|---|---|
| 4,389,567 | 6/1983 | Khoe et al. . |
| 4,944,838 | 7/1990 | Koch et al. . |
| 5,278,926 | 1/1994 | Doussiere . |

FOREIGN PATENT DOCUMENTS

| | | |
|---|---|---|
| A0545820 | 6/1993 | European Pat. Off. . |
| A2195822 | 4/1988 | United Kingdom . |

OTHER PUBLICATIONS

Yoshimoto et al, "Spotsize Convertor Using InP/InAlAs MQW Waveguides for Low–Loss Single Mode Fibre Coupling", Electronics Letters, vol. 28, No. 17, Aug. 13, 1992, Stevenage , Herts, GB, pp. 1610–1611.

Yoshimoto et al, "Spotsize Convorter Using InP/InAlAs MQW Waveguides for Low–Loss Single Mode Fibre Coupling", Electronics Letters, vol. 28, No. 17, Aug. 13, 1992, Stevenage, Herts, GB, pp. 1610–1611.

Doussiere et al, "Tapered Active Stripe for 1.5 Mum InGaAsP/InP Strained Multiple Quantum Well Lasers with Reduced Beam Divergence", Applied Physics Letters, vol. 64, No. 5, Jan. 31, 1994, New York, US, pp. 539–541.

Deri et al, "Low Loss Optical Directional Coupler in InP", Electronics Letters, vol. 25, No. 20, Sep. 28, 1989, Stevenage, Herts, GB, pp. 1355–1356.

Patent Abstracts of Japan, vol. 7, No. 222 (E–2010, Oct. 4, 1983 & JP, A, 58 114 476 (Kokusai Denshin Denwa KK).

Koch et al, "Tapered Waveguide InGaAS/InGaAsP Multi Quantum Well Lasers", IEEE Photonics Technology Letters, vol. 2, No. 2, Feb. 2, 1990, New York US, pp. 88–90.

Namegaya et al, "High Temperature Operation of 1.3 mum GaInAsP/InP Grinsch Strained Layer Quantum Well Lasers", Electronics Letters, vol. 29, No. 4, Feb. 18, 1993, Stevenage, Herts, GB, pp. 392–393.

(List continued on next page.)

*Primary Examiner*—Charles Bowers
*Assistant Examiner*—K. Christianson
*Attorney, Agent, or Firm*—Nixon & Vanderhye P.C.

[57] ABSTRACT

A semiconductor optical device, for example a laser, has a composite optical waveguide including a tapered, MQW active waveguide in optical contact with a substantially planar, passive waveguide. The fundamental optical mode supported by the composite waveguide varies along the length of the composite waveguide so that, in a laser, the laser mode is enlarged and is a better match to single mode optical fibre. A method for making such semiconductor optical devices is also disclosed.

7 Claims, 13 Drawing Sheets

OTHER PUBLICATIONS

Patent Abstracts of Japan, vol. 11, No. 245 (E–531), Aug. 11, 1987 & JP,A,62 058692 (Furukawa Electric Co. Ltd.).

Lealman et al, "Low Threshold Current 1.6 mum InGaAsP/InP Tapered Active Layer MQW Laser with Improved Coupling to Cleaved Singlemode Fibre", Electronics Letters, vol. 30, No. 12, Jun. 9, 1994, Stevenage, Herts, GB pp.973–975.

Marshall, "Low Loss Coupling Between Semiconductor Lasers and Single–Mode Fibre Using Tapered Lensed Fibres", Br Telecom Technol J, vol. 4, No. 2, Apr. 1986.

Brenner et al, "Highly Efficient Fiber–Waveguide Coupling Achieved by InGaAsP/InP Integrated Optical Modeshape Adapters", presented at European Conference on Optical Communications 1993.

Lealman et al, "Low Threshold Current 1.6 $\mu$m InGaAsP/InP Tapered Active Layer Multiquantum Well Laser With Improved Coupling to Cleaved Singlemode Fibre", Electronics Letters, Jun. 9, 1994 vol., 30, No. 12, pp. 973–975.

■ 300 um LONG UNTAPERED (CONVENTIONAL) LASER
□ LINEAR TAPERED DEVICE WITH 300 μm LONG UNTAPERED ACTIVE AND PASSIVE SECTIONS
○ 3 SECTION TAPERED DEVICE WITH 300 μm LONG UNTAPERED ACTIVE AND PASSIVE SECTIONS

—— FIBRE FIELD PROFILE
- - - - LASER LATERAL FIELD PROFILE (x DIRECTION)
......... LASER VERTICAL FIELD PROFILE (y DIRECTION)

■ 300 um LONG UNTAPERED (CONVENTIONAL) LASER
□ LINEAR TAPERED DEVICE WITH 300 μm LONG UNTAPERED ACTIVE AND PASSIVE SECTIONS
○ 3 SECTION TAPERED DEVICE WITH 300 μm LONG UNTAPERED ACTIVE AND PASSIVE SECTIONS

METHOD FOR MAKING OPTICAL DEVICE WITH COMPOSITE PASSIVE AND TAPERED ACTIVE WAVEGUIDE REGIONS

CROSS-REFERENCE TO RELATED APPLICATIONS

This application is a division of our prior application Ser. No. 08/700,925 filed Aug. 23, 1996 now U.S. Pat. No. 5,844,929 which is, in turn, a continuation of PCT application PCT/GB95/00387 filed Feb. 24, 1995 which, in turn, is a continuation-in-part of 08/252,006 filed May 31, 1994.

BACKGROUND OF THE INVENTION

1. Field of the Invention

The present invention relates to a semiconductor optical device, and to a method for fabricating a semiconductor optical device, and in particular to a semiconductor optical device which is adapted to form a low loss interconnection with an optical fibre.

2. Related Art

The development of semiconductor devices and optical fibres, for example for use in optical communications systems, has occurred very much in isolation from each other. Semiconductor devices, for example lasers, have been developed and optimised with their own particular requirements in mind, for example for lasers, low threshold, high bandwidth, narrow linewidth and high output power are all desirable. These requirements, in combination with the fundamental limitations imposed by the available semiconductor materials, in particular their refractive index, has meant that very small waveguide modes have been essential in order to optimise the functionality of these semiconductor optical devices. In contrast, the requirements for optical fibres have been the need for low loss, low material and waveguide dispersion, a range of mechanical properties (including being handleable), and the ability to be spliced. Although the progression from multi-mode to single mode fibres has seen a reduction in the waveguide mode size for optical fibres, the mode size for single mode fibres which in practice can be spliced, is very much larger than the waveguide mode sizes found in semiconductor optical devices. The spot size ($1/e^2$ diameter) of standard telecommunications single mode optical fibre at a wavelength of 1.55 $\mu$m is approximately 10 $\mu$m, whereas the spot size at the output facet of a typical double hetrostructure semiconductor laser is 1.0 $\mu$m by 1.5 $\mu$m.

This large mismatch between the mode spot sizes of semiconductor optical devices and optical fibres means that coupling efficiencies between the two are very low, for example as low as 10% for a laser and a cleaved single mode fibre. In addition, tight alignment tolerances are required in order to maximise the coupling efficiency between a semiconductor laser and an optical fibre, which dramatically increases the cost of packaging semiconductor devices. One of the key economic requirements for the implementation of FTTH (fibre to the home) is the availability of low cost packaged semiconductor lasers. The largest proportion of the cost of the laser is incurred in packaging the device, and a major contribution to this cost is the need to use sub-micron active fibre alignment techniques to align the fibre to the semiconductor laser.

A technique for increasing the coupling efficiency between semiconductor devices and optical fibre is described in "Low Loss Coupling Between Semiconductor Laser And Single Mode Fibre Using Tapered Lensed Fibres" I W Marshall, British Telecom Technology Journal, Vol. 4, No. 2, April 1986. This paper describes how lenses can be formed on the end of single mode fibres by first drawing the fibre to a taper, by holding it under tension in the arc of a fusion splicer, and then forming a lens by melting the tip of the taper. While this technique does indeed increase the coupling efficiency between the fibre and the semiconductor laser, it significantly increases the cost of packaging these devices. In addition to the cost of actually forming the lens, higher alignment tolerances are required when such a lens is utilised, relative to those required with a cleaved fibre end. This arises because the sensitivity of the coupling loss to misalignment of the lensed fibre increases as the lens radius decreases, so that alignment tolerances must be traded for increased coupling efficiency.

An alternative approach to increasing the coupling efficiency between semiconductor optical devices and optical fibres, which also reduces the alignment tolerances required when packaging these devices, comprises the use of passive mode converters. Such devices are described in, for example, "Highly Efficient Fibre Waveguide Coupling Achieved By InGaAsP/InP Integrated Optical Mode Shape Adapters" presented at European Conference on Optical Communications 1993 by T Brenner and H Melchior and "Spot Size Converters Using InP/InAlAs Multiquantum Well Waveguides For Low Loss Single Mode Fibre Coupling" Electronic Letters 1992, Vol. 28, pp 1610–1617, N Yoshimoto et al. These devices are passive optical components which serve to optically connect single mode fibres to semiconductor devices by utilising tapered waveguide sections to transform the small semiconductor modes into the much larger mode of a single mode fibre. A very gradual change in the waveguide parameters of these passive mode converters is required to allow the optical mode to expand adiabatically, in order to avoid high losses. Although these passive mode converters do improve the coupling efficiency between semiconductor devices and optical fibres, and also increase the alignment tolerances, they comprise a further component which must be aligned and packaged between the semiconductor optical device and the optical fibre, and thus increase the complexity, size and cost of these packaged devices.

A laser having an integrated passive tapered waveguide which increases its output spot size is described in "Tapered Waveguide InGaAs/InGaAsP Multiple Quantum Well Lasers" T L Koch et al, IEEE Photonics Technology Letters, Vol. 2, No. 2, February 1990. This device employs a conventional multi-quantum well active layer, and a number of passive waveguide layers which are successively etched at different points along the length of the device in order to achieve a stepped, tapered waveguide. The active layer is evanescently coupled to the passive tapered waveguide, and a further passive "outrigger" waveguide spaced a considerable distance from the tapered waveguide, is also employed. The design allows little flexibility for the optimisation of the laser, for example the active layer is limited in thickness by the need to achieve a high degree of evanescent coupling to the passive tapered waveguide. This thickness limit on the active layer limits the high temperature performance of the laser. Furthermore the use of a stepped, tapered passive waveguide requires a large number of additional stages of photolithography, and thus considerably increases the complexity and cost of device fabrication.

SUMMARY OF THE INVENTION

According to a first aspect of the present invention there is provided a semiconductor optical device comprising a composite optical waveguide having first and second ends, the composite waveguide comprising:

a first optically waveguiding region of semiconductor material, which first region is optically passive and is substantially planar, and a second optically waveguiding region of semiconductor material, which second region is optically active, comprises a multi-quantum well structure, and is tapered along a substantial part of the length of the second region, from the first end to the second end of the composite waveguide, in a direction substantially parallel to the plane of the first region, wherein the first and second regions are in optical contact, and the size of the fundamental optical mode supported by the composite waveguide varies along the length of the composite waveguide and wherein the first region is of substantially constant width along the length of the composite waveguide.

Thus, in contrast to the device disclosed by Koch et al which comprises an active region of uniform cross-section, and a tapered passive region, a device according to the present invention comprises a tapered multi-quantum well active region in optical contact with a passive planar waveguide. This arrangement gives far greater flexibility in the design of active semiconductor optical devices having large output spot sizes. For example, because the multi-quantum well active region is laterally tapered i.e. tapered in a direction parallel to the plane of the passive waveguide, there is greater flexibility in the allowable thickness of the active layer. This multi-quantum well active layer can be chosen to be sufficiently thick that the device has good high temperature performance, without degrading the degree of optical coupling between the active and passive waveguides. This extra degree of flexibility in design arises because the active region becomes less strongly guiding as it is tapered, and because it comprises a multi-quantum well structure. The use of a multi-quantum well structure allows greater flexability in the design of the composite waveguide, for example, the average refractive index of the active layer can be kept reasonably low, while still ensuring that effective amplification occurs in this active region. The use of a lower refractive index active layer, facilitated by the presence of a multi-quantum well structure, enables the length of the tapered portion of the active region to be reduced. Furthermore, due to the lower average refractive index of a multi-quantum well active region, this active region can be truncated at a larger width, thus reducing the overall device length. Since the costs of a semiconductor device are in part related to the size of the semiconductor chip employed, this reduction in taper length will allow a reduction in device cost.

The use of a multi-quantum well structure active region also facilitates the simplification of the passive waveguiding region, and preferably the passive region is of substantially constant width along the length of the composite waveguide.

The present invention thus provides, for example, a laser having a large spot size output which is better matched to the spot size of standard single mode telecommunications optical fibre, whose other characteristics, for example threshold current, and high temperature performance, have not been unduly compromised. Such large spot size lasers achieve higher coupling efficiencies to optical fibres, and thus allow simple cleaved fibre ends, rather than expensive tapered lensed fibre ends, to be employed. The use of cleaved fibre ends, in combination with a large spot sized laser, may improve the fibre alignment tolerances to such an extent that low cost passive (i.e. without active monitoring of the laser light launched into the fibre) fibre alignment techniques could be employed during the packaging process. Conventional semiconductor laser packages incorporate an active cooling device (e.g. a Peltier element) for maintaining the temperature of the laser chip at a low level, for example at, or below room temperature. A further reduction in the cost of packaged lasers may be achieved if the active cooling device for the laser chip is excluded. This may be possible with lasers according to the present invention because of their good high temperature performance.

Advantageously the tapered part of the optically active region is truncated. Although truncation of the taper does cause loss due to the discontinuity in refractive index experienced by light travelling down the taper, it has surprisingly been found that this truncation loss does not greatly affect the performance of devices according to the present invention. This truncation of the taper allows the taper length to be reduced significantly. Furthermore, it is believed that truncating the taper avoids the undesirable effect of non-radiative recombinations at the edge of the active region which could become significant as the active volume is reduced.

Advantageously the optically active region is tapered in a direction substantially perpendicular to the plane of the passive region. Reducing the height, as well as the width, of the optically active region will further reduce the strength of the optical waveguiding of this region, thus increasing further the size of the optical mode supported by the composite waveguide. Tapering the height of the optically active region may also reduce the loss due to truncation of the taper.

According to a second aspect of the present invention there is provided a method, comprising the steps of 1) epitaxially growing a planar wafer comprising an active region above a passive region;

2) defining a first mesa comprising the active region;

3) forming a mask on the first mesa, the width of the mask being less than the width of said first mesa, the mask width varying along the length of the mask; and 4) defining a second mesa, of substantially the same width as the first mesa, which second mesa comprises the passive region, and redefining the first mesa to correspond to the mask.

The method of the present invention thus provides a simple, two stage, technique for defining a composite waveguide structure having a tapered active region, and a planar passive region. The method has the further advantage that optical and electrical confinement layers can be easily grown right up to the sides of the first and second mesas, for example to form the reversed biassed current blocking layers of a buried hetrostructure device.

BRIEF DESCRIPTION OF THE DRAWINGS

The invention will now be described, by way of example only, with reference to the accompanying drawings, in which.

DETAILED DESCRIPTION OF EXEMPLARY EMBODIMENTS

The exemplary embodiment of the present invention is a large spot size laser, although it will be appreciated that the present invention may be advantageously applied to any semiconductor optical device, and that some such devices, for example an optical amplifier, may require the optically active region to be tapered at both of its ends.

When designing a large spot size laser, a number of, sometimes conflicting, design considerations need to be taken into account. The passive waveguide should have a spot size which is well matched to the spot size of the waveguide into which the laser mode is to be launched, for example an optical fibre or an ASG (arsenic doped silica glass) waveguide. The tapered active region needs to be tapered sufficiently slowly so as not to cause excessive loss, and yet sufficiently rapidly so as to give a device of reasonable length. The theoretical basis of these design considerations will now be discussed, before describing the fabrication of a large spot size laser, and the performance of the resulting device.

Figure 1:
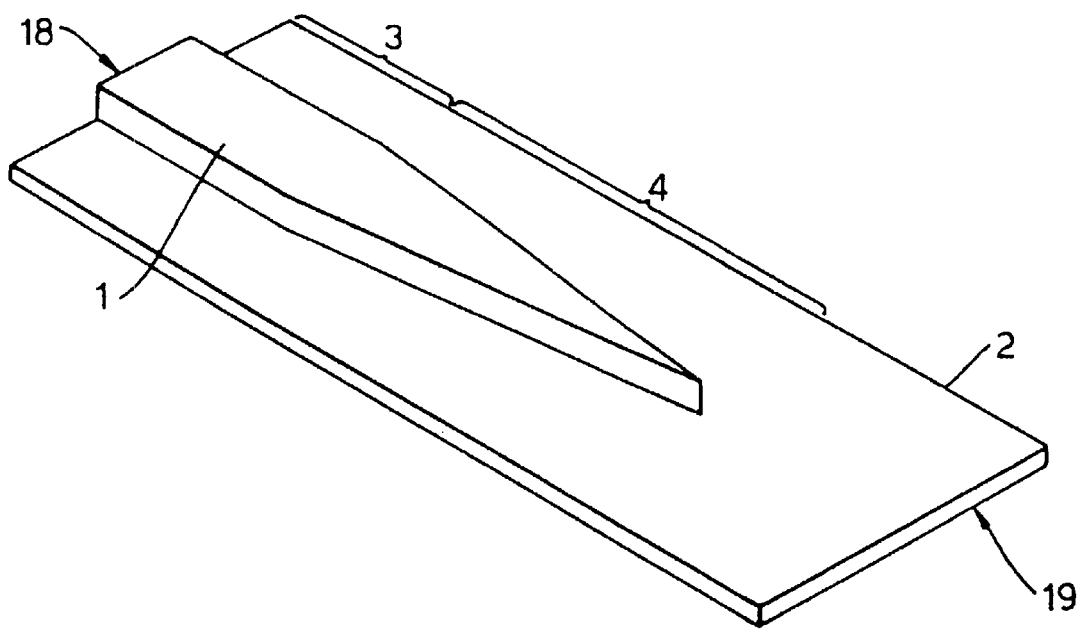
FIG. 1 shows a schematic of the composite waveguide structure employed in a large spot size laser according to the invention.

Referring to FIG. 1, the composite waveguide structure comprises an MQW (multi-quantum well) active waveguide 1 and a passive planar waveguide 2. The active waveguide comprises a section of constant width 3, and a tapered section 4.

Dealing firstly with the design of the passive waveguide 2. The passive guide structure 2 was modelled using a finite difference programme which indicated that a passive guide 0.16 $\mu$m thick by 3.0 $\mu$m wide would give a spot size of 3.8 $\mu$m by 2.6 $\mu$m, where the spot size was measured as $1/e^2$ of the guided mode intensity. These results show this structure is a good candidate for the passive guide, since its spot size would be well matched to both cleaved small core fibre and ASG waveguides (which have a spot size of approximately 3.5 $\mu$m). The choice available for the material wavelength, and therefore refraction index, of the passive guide 2 is fairly broad. The main consideration is that the material wavelength of the passive guide 2 should be less than that of the active region 1 to ensure it is low loss. Reducing the wavelength and therefore refractive index of the passive guide 2 will allow its thickness to be increased, thus giving a degree of design latitude. The passive waveguide should have a thickness and refractive index which ensure that it remains single-moded at the wavelength of operation, for efficient coupling to single mode optical fibre.

The length of the passive waveguide 2 should be greater than the length of the active waveguide 1, so that after the end of the tapered active waveguide the mode of the composite waveguide is allowed to "settle down" before it reaches the front facet of the device. This is desirable because the spot size of the mode at the point where the tapered region is truncated will in general be smaller than the guided mode supported by the passive region. Therefore once the mode passes from the tapered region into the passive region, having incurred some loss at the interface of said regions, it will slowly expand and evolve into the passive waveguide mode. The length of the passive region required to achieve this is dependant on the design of both the active and passive guides.

Turning now to the design of the active waveguide 1 and in particular to the length of the tapered section 4, the method employed to calculate the required taper length is an approximation based on Love's method (see J D Love, W M Henry, W J Stewart, R J Black, S Lacroix and F Gonthier, "Tapered Single Mode Fibres and Devices, Part 1: Adiabaticity Criteria", IEE Proc J, 1991, Vol 138, No. 5, pp343–354) of calculating critical taper lengths for optical fibres. The method is derived from the physical argument that the local taper length must be larger than the coupling length between the fundamental mode and the dominant coupling mode if loss is to be small. A local taper angle is defined by $Q(z)=\tan^{-1}|dp/dz|$ where z is the distance along the taper, and $p=p(z)$ is the local guide radius. In this approximation the local radius $\rho$ is replaced by the local active half width w. The coupling length between the fundamental and second mode is taken to be the beat length $z_b$. Where $$z_b = \frac{2\Pi}{\beta_1 - \beta_2} \quad (1)$$

and $\beta_1$ and $\beta_2$ are the respective propagation constants. Therefore the local taper angle is given by $$\Omega = \frac{w(n_1 - n_2)}{2\lambda} \quad (2)$$

where $n_1$ and $n_2$ are the effective indices of the guided modes and in this case $n_2$ is the substrate index if the guide is designed to be single moded. Integrating Q over all active widths gives a critical taper length $z_c$. For taper lengths $>>z_c$ the loss will be small and the taper can be assumed to be adiabatic. While for taper lengths $<<z_c$ there will be significant loss into the substrate.

Figure 2:
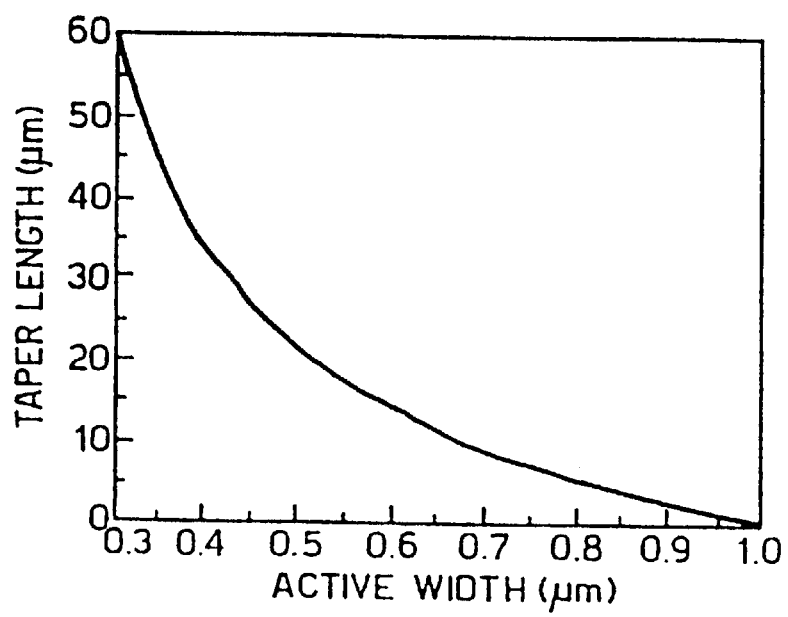
FIG. 2 is a graph of the critical taper length against the width of the active waveguide, calculated using Love's method.
Figure 3:
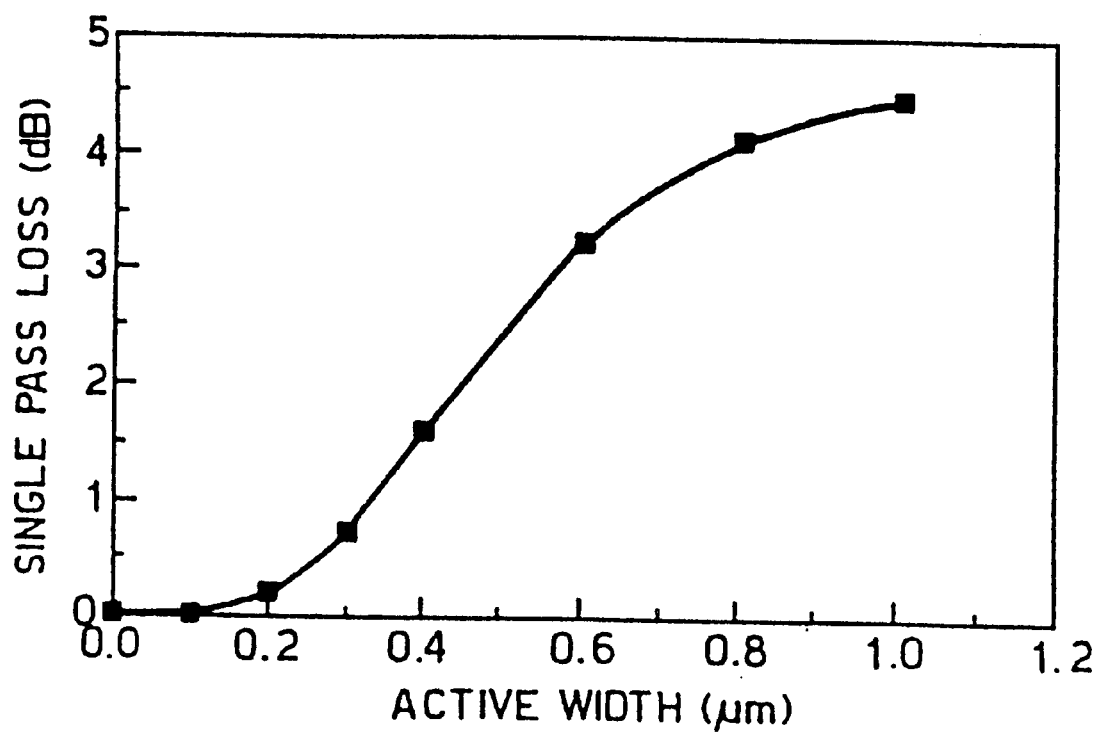
FIG. 3 is a graph of the single pass loss vs. active waveguide width truncation for a 16 well MQW active layer on a 3.0 $\mu$m wide, 0.16 $\mu$m thick passive guide.

The critical taper length according to these calculations for different widths of active waveguide 1 are plotted in FIG. 2. From this it can be seen that as the active waveguide width is reduced, and particularly as it approaches zero, the taper length required for adiabatic mode expansion increases rapidly. Therefore it is important to assess the loss of the composite waveguide structure if the active width is truncated before it has tapered down to zero width. This truncation loss is calculated by carrying out an overlap integration between the passive waveguide mode and the mode in the tapered waveguide at the specified active width. The field profiles required for these integrals are obtained using a finite difference method. The results of this calculation are plotted in FIG. 3 and it can be seen that if the active waveguide width is reduced to 0.3 µm prior to truncation the single pass is <1 dB. It should be noted that these loss values assume that the guide taper has been adiabatic up to the point of truncation.

The length of the untapered section 3 of the active waveguide required, depends on the design of the active region, and the length of the taper 4. The length of the untapered section 3 required is reduced as the available gain from the active region is increased, or the length of the tapered section 4 is increased. The amount of gain available from the active region can be increased, in a multiquantum well laser, by increasing the number of wells. This has the effect of reducing the device length required for a specified threshold current. Clearly as the length of the tapered section 4 of the active region is increased, the length of untapered section 3 required will reduce, and it should be noted that with very long taper lengths, for example 800 m µm, an untapered section 3 of the active region may not be required at all.

A further advantage in employing a MQW structure active region, as opposed to a bulk semiconductor active region, is that the average refractive index of the active region can be reduced compared to that of a bulk active region. This enables the refractive index of the active region to approach more closely the index of the passive waveguide, with the effect that a lower loss is suffered by the composite mode at the end of the active region.

The fabrication of a large spot size laser will now be described. The process schedule for the fabrication of the large spot size laser is as follows:

| 1 | Grow planar wafer |
| 2 | Define first, wide mesa |
| 3 | Define second tapered mesa |
| 4 | Notch active layer, heat treat to cause material transport and carry out first stage overgrowth of confinement layers |
| 5 | Remove oxide |
| 6 | Carry out second stage overgrowth |
| 7 | Define ternary mesa |
| 8 | Define contact window |
| 9 | Thin to 90 µm |
| 10 | Deposit p side metal |
| 11 | Deposit n side metal |

Figure 4:
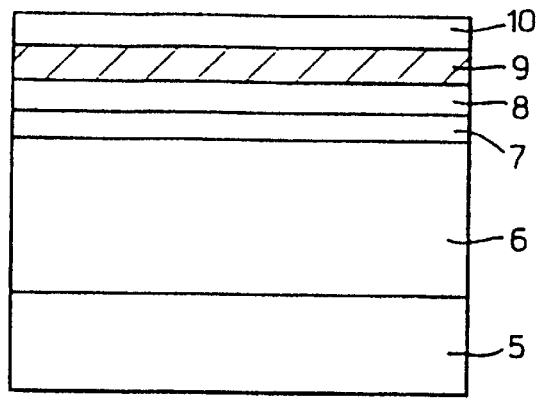
FIG. 4 shows an epitaxially grown planar wafer.

With reference to FIG. 4, a planar wafer is grown by conventional MOVPE techniques, comprising an n doped InP substrate 5, an n doped InP buffer layer 6, a 1.1 µm quaternary passive waveguide layer 7 which may be either n doped or undoped, an n doped InP spacer layer 8, an active layer 9, and a p doped top InP layer 10. Further details of these layers are given in Table 1.

TABLE 1

| Layer | Composition | Thickness | Doping |
| --- | --- | --- | --- |
| Cap | InP | 0.2 µm | p5-7e17 |
| Top SCH | 1.3 Q | 100 Å | nominally undoped |
| MQW active | See below | 0.268 µm | nominally undoped |
| Bottom SCH | 1.3 Q | 100 Å | nominally undoped |
| Spacer layer | InP | 0.2 µm | n 1-2e18 |
| Passive guide | 1.1 Q | 0.16 µm | n 1-2e18 |
| Buffer | InP | 3 µm | n 1-2e18 |
| Substrate | InP | 300 µm | n 1-2e18 |

Where the term SCH refers to a separate confinement heterostructure. The MQW active layer is composed of sixteen 80 Å thick InGaAs wells, separated by fifteen 80 Å 1.3 Q barriers, and has an average refractive index of 3.477 at 1.55 µm (cf 3.56 for bulk active material designed to lase at 1.55 µm).

Since the passive waveguide is fairly weakly guiding the doping of the substrate and buffer layers are matched so as to prevent optical energy being launched into substrate modes.

Figure 5A:
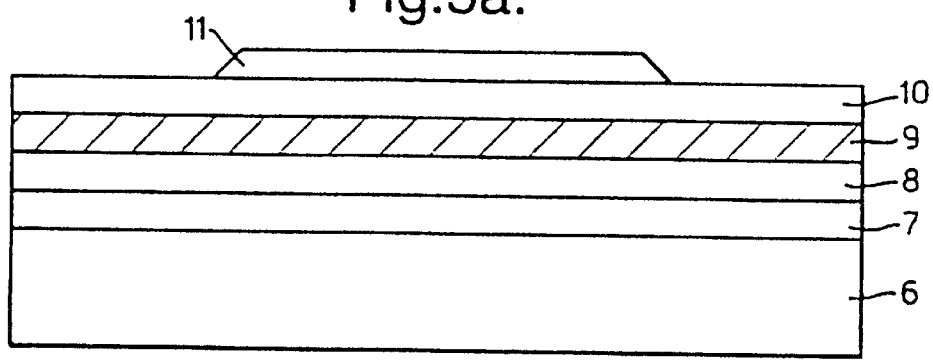
FIGS. 5 a) to e) show various stages in the growth of a double mesa structure, of a large spot size laser according to the invention.
Figure 5B:
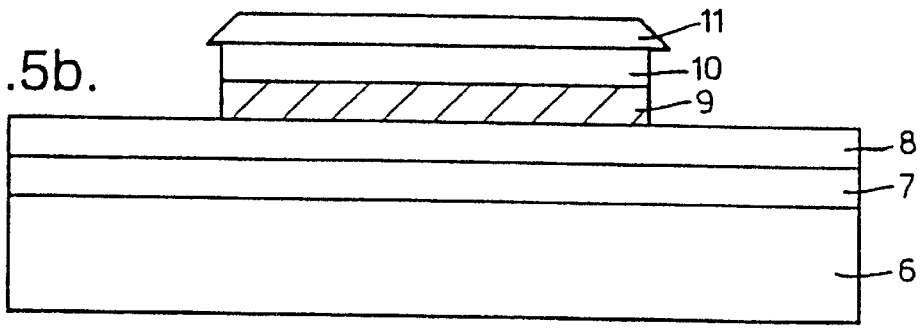
Figure 5C:
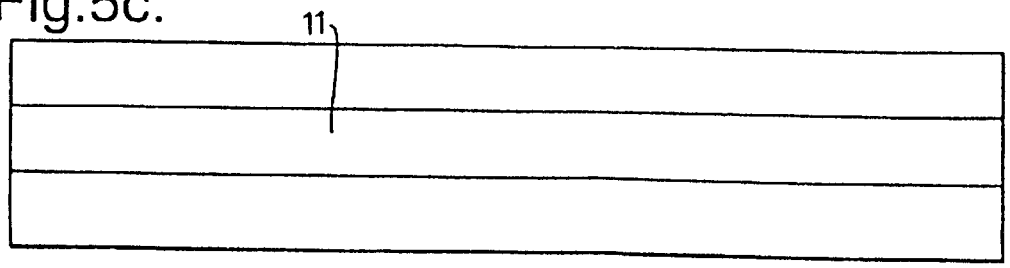
Figure 5D:
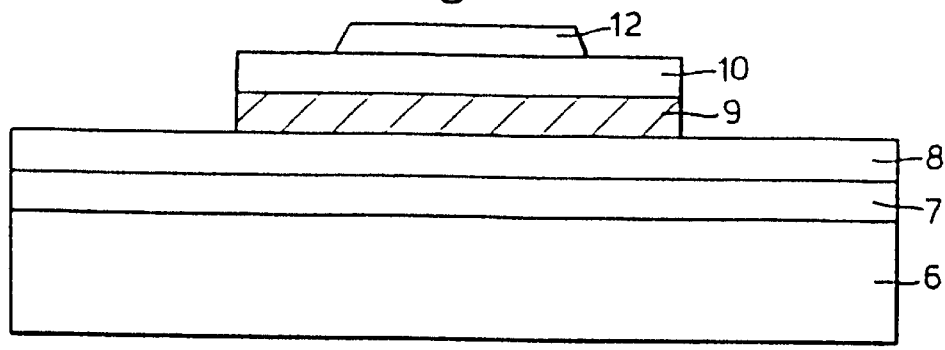
Figure 5E:
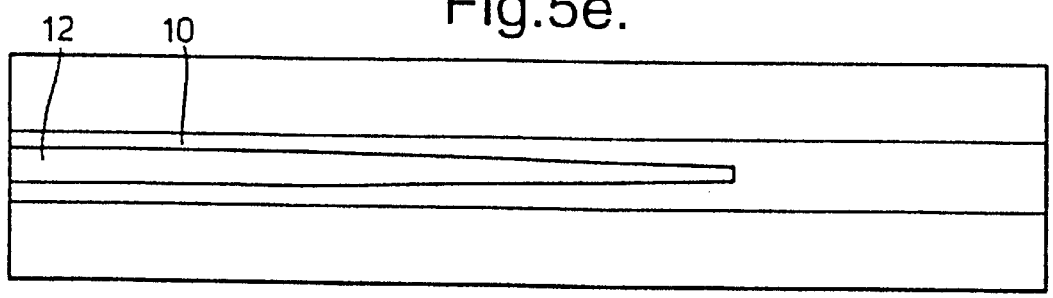
Figure 6A:
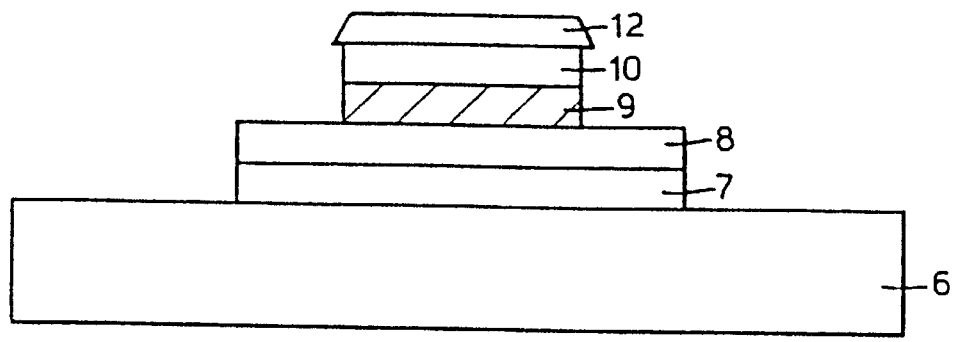
FIGS. 6 a) to d) show further stages in the growth of the double mesa structure from each end of the device.
Figure 6B:
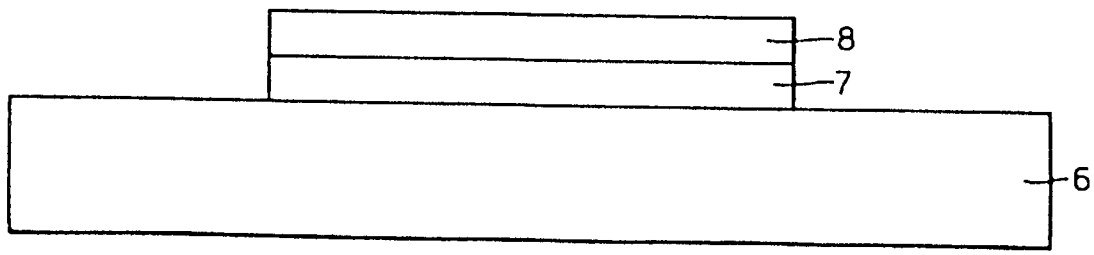

Once the planar wafer has been grown by MOVPE, a silica layer is deposited by CVD (Chemical Vapour Deposition) and a mask 11 (shown in FIG. 5) is defined by photolithography and etched in a 10% solution of buffered HF. This silica mask 11 defines the final width of the passive planar waveguide 2. The dimensions of the passive waveguide 2 will depend on the waveguiding properties desired, for the large spot size laser described herein the passive waveguide 2 has a constant width of 3 µm, and extends along the whole length of the device. The first, wide mesa is then etched down to the bottom of the active region 9, as shown in FIG. 5b. The mesa is first dry etched using 15% methane/hydrogen reactive ion etching (RIE), to a depth that is within 0.1 µm of the base of the active layer 9. The mesa is then wet etched in 3:1:1 (Sulphuric Acid:Hydrogen Peroxide:Water) to the bottom of the active layer 9. This etchant is selective and stops at the top of the InP spacer layer 8. The plan view of the planar wafer, shown in FIG. 5c, shows the constant width of this first mesa. A second stage of silica deposition, photolithography and etching is then carried out, to give a tapered mask 12, shown in FIGS. 5d and e. This mask 12 defines the final width of the active layer 9. The second, tapered, mesa is now etched by employing a dry etch followed by a wet etch, as for the first mesa. The etch details are the same as above. The thickness of the spacer layer 8 and passive guide 7 are equal to or less than the depth to which the mesa is dry etched. This ensures that the passive guide is completely etched through, since the etch rate of 3:1:1 is strongly dependent on the composition of the guide, and reduces as the material wavelength is shortened. In addition to removing material from the top InP layer 10 and the active layer 9 at either side of the mask 12, this etch also removes material from the spacer layer 8 and passive layer 7 at either side of the first, uniform width, mesa. In this way the terraced structure shown in FIG. 6a is formed. FIG. 6a shows a schematic cross-section of the device from the direction 18 shown in FIG. 1, while FIG. 6b shows a schematic cross-section of the same device in the direction 19 shown in FIG. 1. The tapered end of the mask 12 has been truncated, as can be seen in FIG. 5e, and thus at the end 19 of the device shown in FIG. 6b, all of the active layer 9 and top InP layer 10 have been etched away.

Figure 6C:
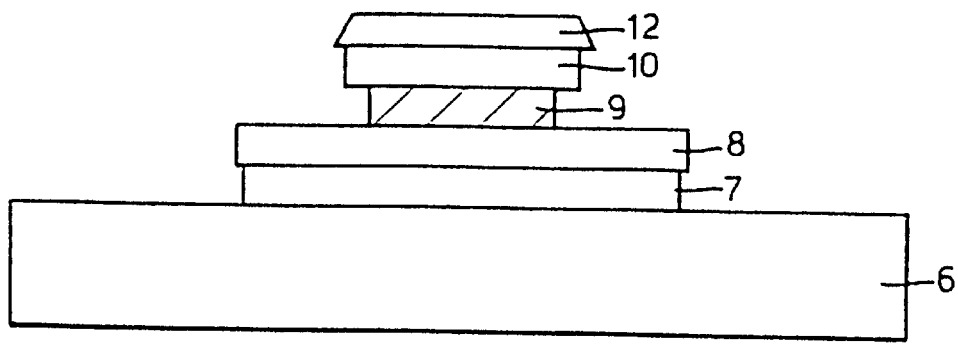
Figure 6D:
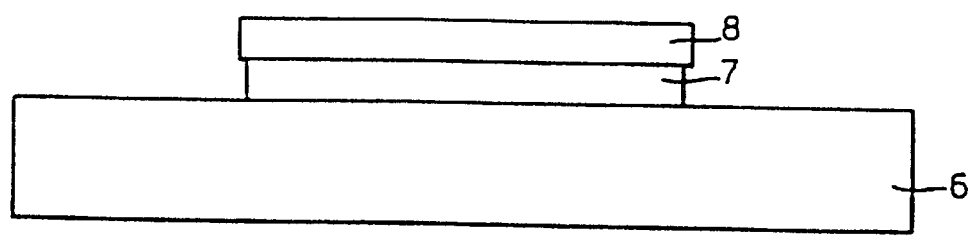

The active layer 9 is then "notched" (shown in FIG. 6c) by applying an etchant which attacks only the active layer 9. A suitable etchant comprises sulphuric acid, hydrogen peroxide, and water in the ratio 3:1:1. This "notching" of the active layer 9 is believed to provide a clean, fresh surface on the side of the active layer 9, which benefits the subsequent processing steps.

The whole device is then heated to approximately 700° C. for 20 minutes in an over pressure of phosphine in order to cause material transport. This treatment converts the mesa shape from that in FIG. 6c to that in 7a, and also covers the edge of the active region with InP.

Figure 7A:
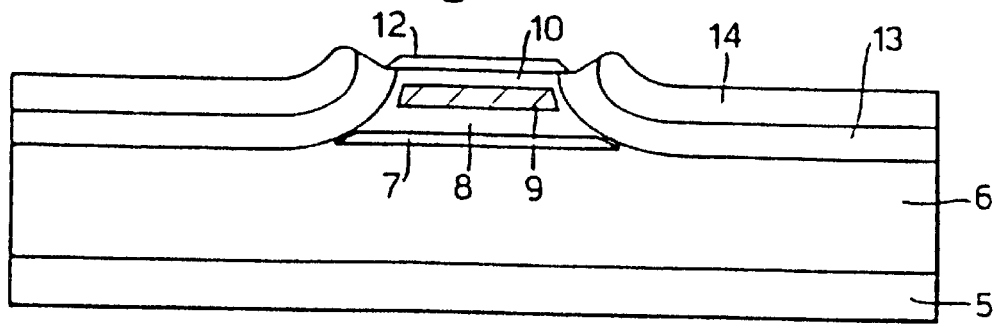
FIGS. 7 a) and b) shows the device after notching, and material transport, with the confinement layers in place.
Figure 7B:
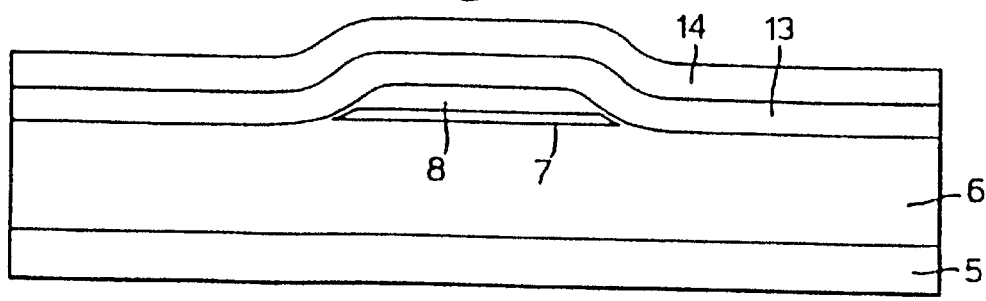
Figure 8A:
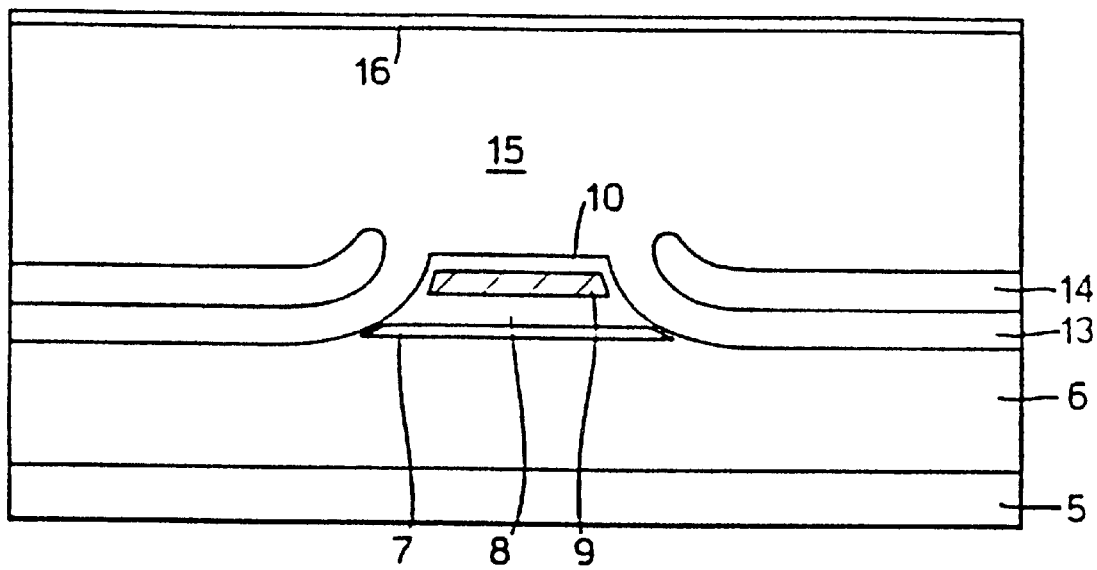
FIGS. 8 a) and b) shows the device after second stage overgrowth.
Figure 8B:
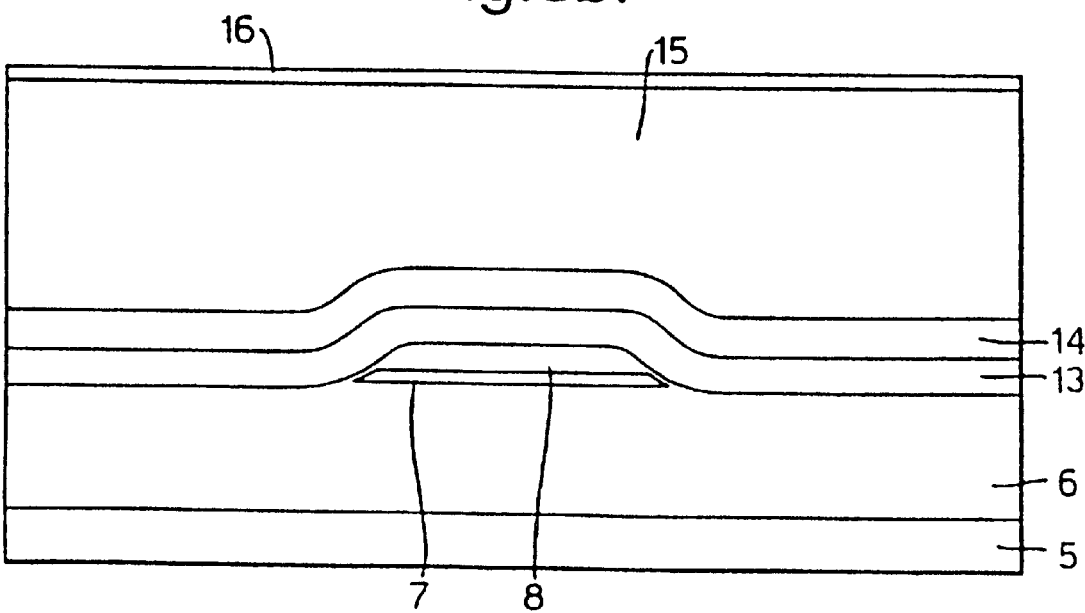

Optical and electrical confinement layers 13 and 14, shown in FIG. 7, are grown to the top of the tapered active mesa 1. The first confinement layer 13 comprises 0.5 $\mu$m p type InP at 7–8e17, while the second confinement layer 14 comprises 0.4 $\mu$m n type InP at 1–2e18. These confinement layers 13 and 14 serve to confine the electrical carriers and the photons generated from recombinations of these carriers, to the active layer 9.

Finally, the device is overgrown with 1.0 $\mu$m p type InP at 7–8e17 followed by 1.5 $\mu$m of p type InP at 1–2e18 which comprises layer 15 and 0.1 $\mu$m of p type InGaAs at >1e19 which comprises the contact layer 16.

Figure 9A:
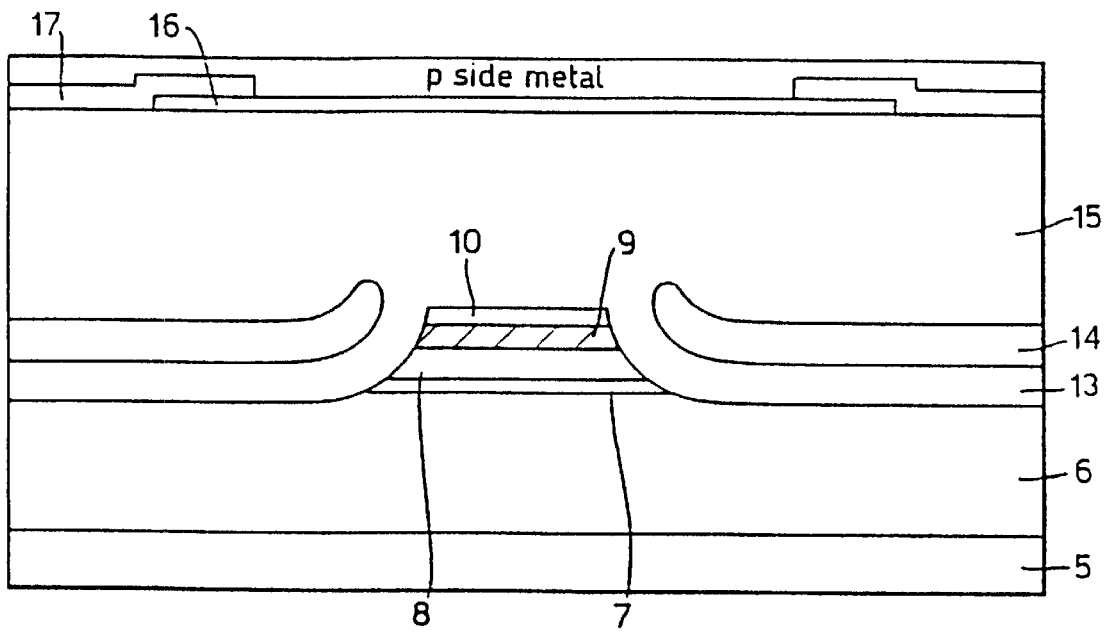
FIGS. 9 a) and b) show a schematic cross section of the completed device from each end.
Figure 9B:
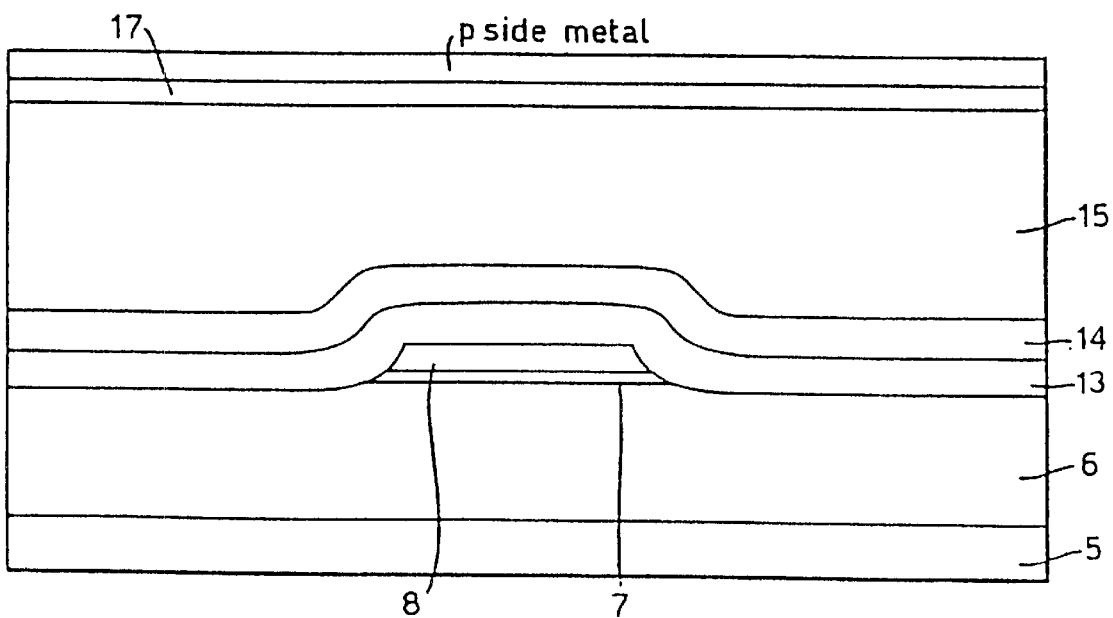

The contact layer 16 is patterned, a silica mask 17 is deposited, and a contact window is defined in this mask 17 in a conventional manner. The device is completed by depositing p and n side titanium-gold metal contacts. FIG. 9 shows a schematic cross-section of the completed device, from direction 18 in FIG. 9a and from direction 19 in FIG. 9b.

A number of large spot size lasers have been fabricated, using tapered masks 12 having different taper lengths 4. The taper lengths employed were 60 $\mu$m, 180 $\mu$m, 400 $\mu$m and 800 $\mu$m. Two mask taper profiles were used, a linear taper, and a three section approximation to the critical taper length curve shown in FIG. 2.

Figure 18:
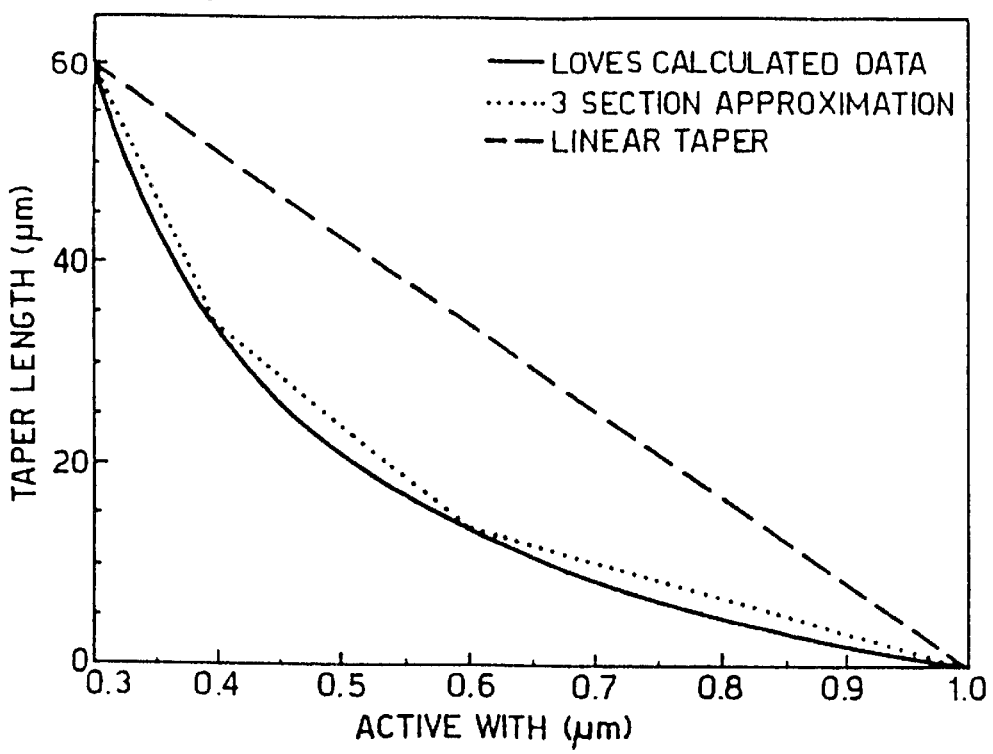
FIG. 18 is a graph showing the taper profile for a linear taper, and a three section taper of 60 $\mu$m taper length, compared to the critical taper length by Love's method.

The dimensions of the three section tapers employed are given in Table 2, and FIG. 18 shows the three section taper for the 60 $\mu$m taper length, together with the 60 $\mu$m linear taper profile, and the critical taper length curve for 60 $\mu$m.

TABLE 2

| Active Width in $\mu$m | Taper section lengths in $\mu$m's | | | |
|---|---|---|---|---|
| | 60 $\mu$m taper | 180 $\mu$m taper | 400 $\mu$m taper | 800 $\mu$m taper |
| 1.0–0.6 | 14 | 42 | 92 | 185 |
| 0.6–0.4 | 20 | 60 | 134 | 265 |
| 0.4–0.3 | 26 | 78 | 174 | 350 |

Preferably the optically active region is tapered along at least 5% of its length and more preferably more than 10% and less than 80% of its length. However, it may in some applications be tapered along its entire length.

Figure 10:
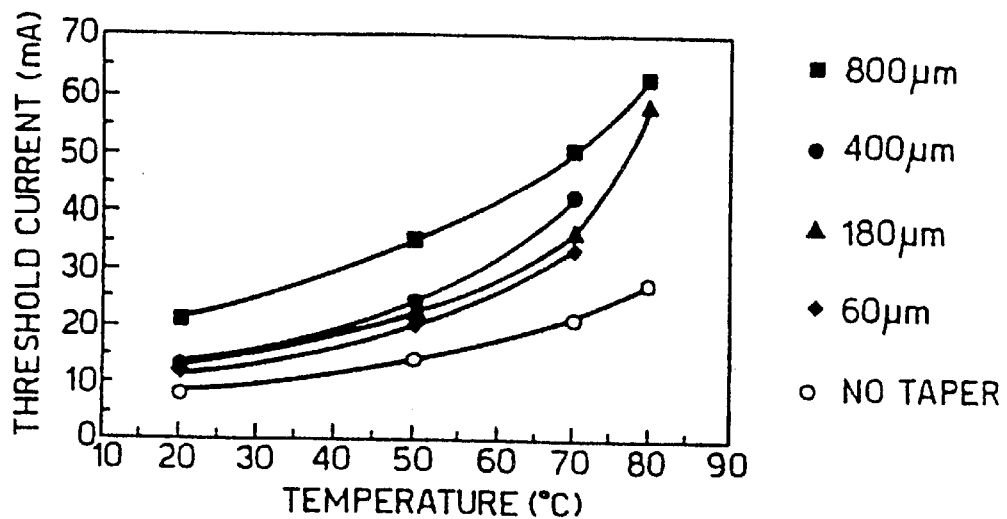
FIG. 10 is a graph of the threshold current of large spot size lasers according to the invention having different taper lengths, as a function of temperature.

The performance of the large spot size lasers is good, the shorter taper length lasers show only a small increase in threshold current when compared to conventional lasers. The threshold currents for different taper length devices as a function of temperature are shown in FIG. 10, as are those for a conventional un-tapered laser. All the devices operated to a high temperature i.e. 70° C., as can be seen from FIG. 10.

Figure 11:
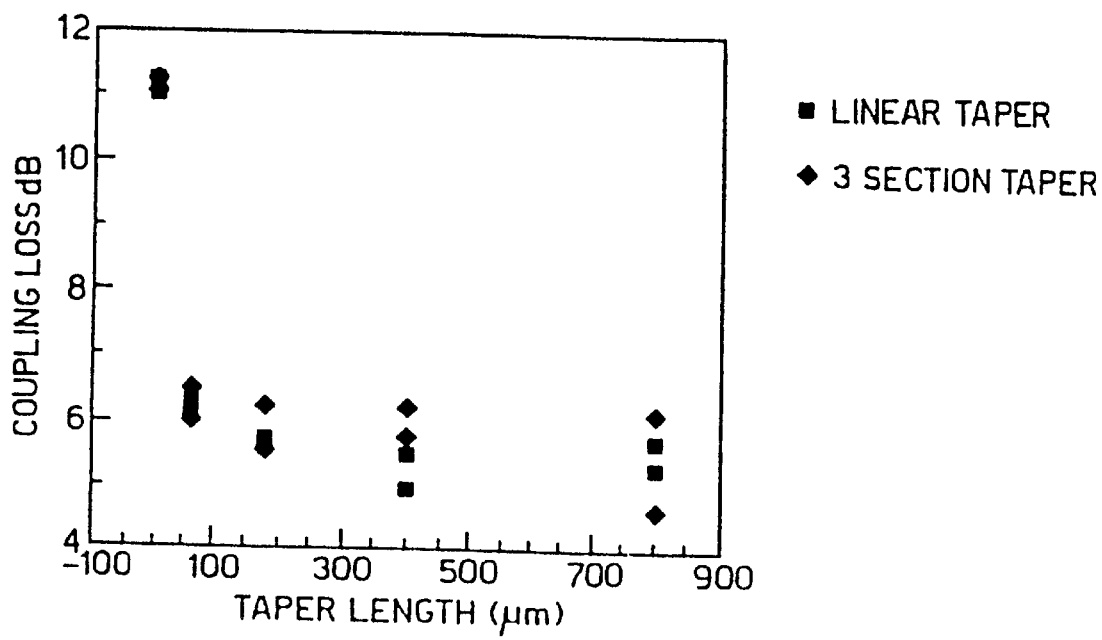
FIG. 11 is a graph showing the coupling efficiency of large spot size lasers of different taper lengths to standard cleaved fibre.

Coupling measurements carried out between these large spot size lasers and cleaved fibres show a significant improvement compared to conventional lasers. Coupling measurements to standard 8–9 $\mu$m core optical fibre, are shown in FIG. 11, and to small core fibre in FIG. 12. The results obtained for standard fibre, show coupling losses down to 4.5 dB for the 800 $\mu$m taper device, which represents a 5 to 6 dB improvement in mean coupling strength over an un-tapered device. It can be seen that the performance of both linear and 3 section taper devices are comparable, and that only a small increase in coupling is obtained as the taper length is increased from 60 to 800 $\mu$m. The modest spot size of this device, increased from $\approx$1 $\mu$m to $\approx$3 $\mu$m ($1/e^2$ of intensity), meant that no improvement in alignment tolerance was observed for tapered devices when compared to un-tapered devices. In order to increase the alignment tolerance to cleaved fibre, the spot size of the device would need to be enlarged much further. However the use of cleaved fibre as opposed to lens ended fibre increases the 3 dB alignment tolerance from ±1.5 $\mu$m to ±3.5 $\mu$m.

Figure 12:
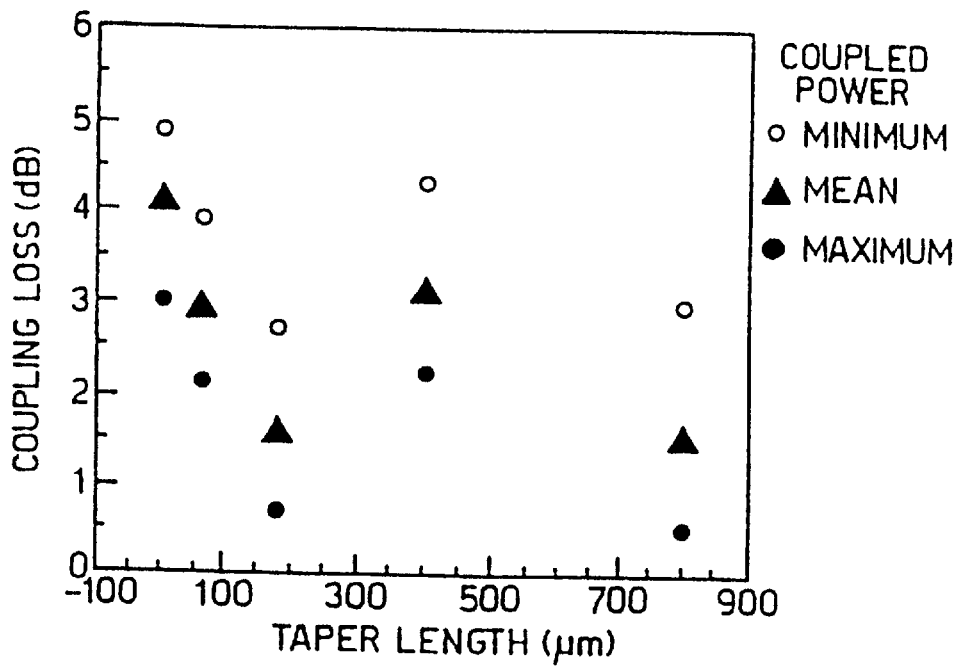
FIG. 12 is a graph showing the coupling efficiency of large spot size lasers having different taper lengths to cleaved small core fibre.

Better results were obtained for coupling to small core fibre ($1/e^2$ $\approx$2.0 $\mu$m) (as shown in FIG. 12) since the laser spot size is better matched to the spot size of this fibre. In this case it can be seen that mean coupling efficiencies of up to −1.5 dB have been obtained. The 3 dB alignment tolerance of the tapered devices to this small core fibre was ±2.0 $\mu$m.

In order to improve the coupling loss between large spot size lasers and optical fibre further, a device with a spot size more closely matched to cleaved standard single mode fibre is required. Both design work and experiment work has been carried out which shows it is feasible to fabricate such a device.

Figure 13:
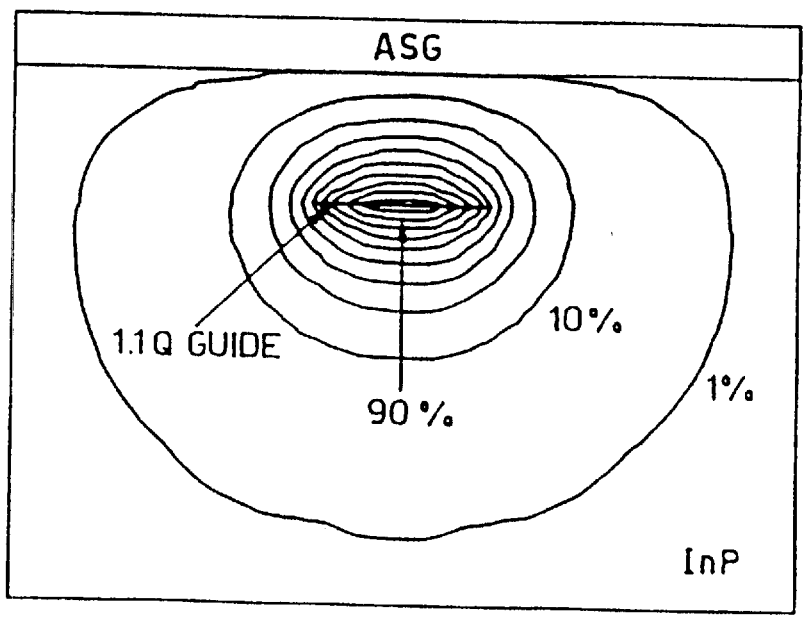
FIG. 13 is a contour plot showing the optical field distribution calculated for a 7 $\mu$m wide, 0.07 $\mu$m thick, 1.1 $\mu$m quaternary passive waveguide with 5 $\mu$m InP overgrowth and arsenic doped silica glass (ASG)

If the laser spot size were increased to $\approx$8 $\mu$m it would closely match the mode size of standard single mode fibre. This could allow losses of 1 dB or less to be obtained when coupling to cleaved standard single mode fibre. One of the first problems encountered is the result of the large spot size. While it is relatively easy to design a passive guide that will give a spot 8 $\mu$m by 8 $\mu$m it is not so easy to fabricate a device with it. Such a structure would require $\approx$8 $\mu$m of InP to be grown over the guide if the field in the vertical axis was not to be distorted. Since the maximum thickness that can be easily regrown is $\approx$5 $\mu$m, this limits the vertical height to less than this. However there are no such constraints on the horizontal spot size. Therefore a guide of 1.1 $\mu$m quaternary 7 $\mu$m wide by 0.07 $\mu$m thick is chosen as the passive guide, since this gives a spot 8 $\mu$m wide by 5 $\mu$m high whose index and profile are virtually unaffected by the limited overgrowth thickness. The calculations for this structure were carried out using a variable grid finite element programme, and a contour plot of the E-field for this structure is shown in FIG. 13.

Figure 14:
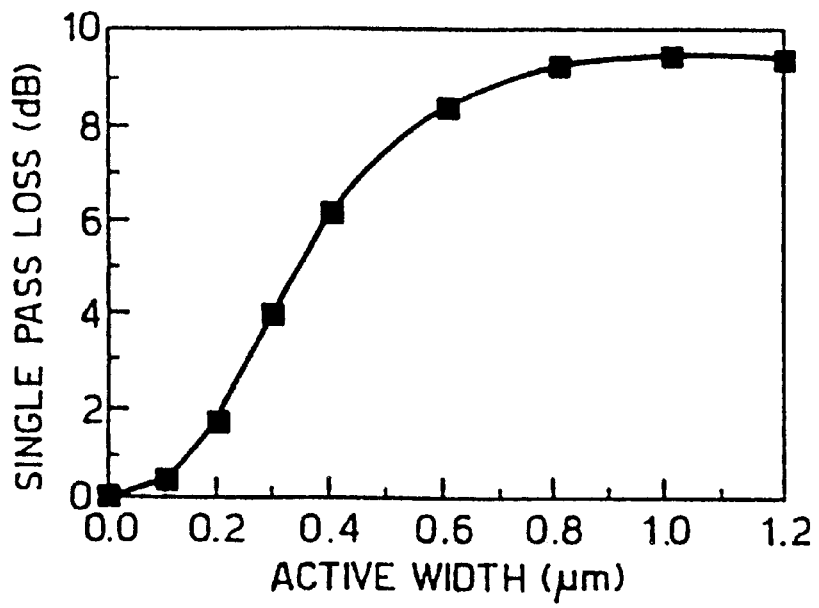
FIG. 14 is a graph showing the truncation loss against active waveguide width for a 16 well active layer device having the passive waveguide shown in FIG. 13.
Figure 15:
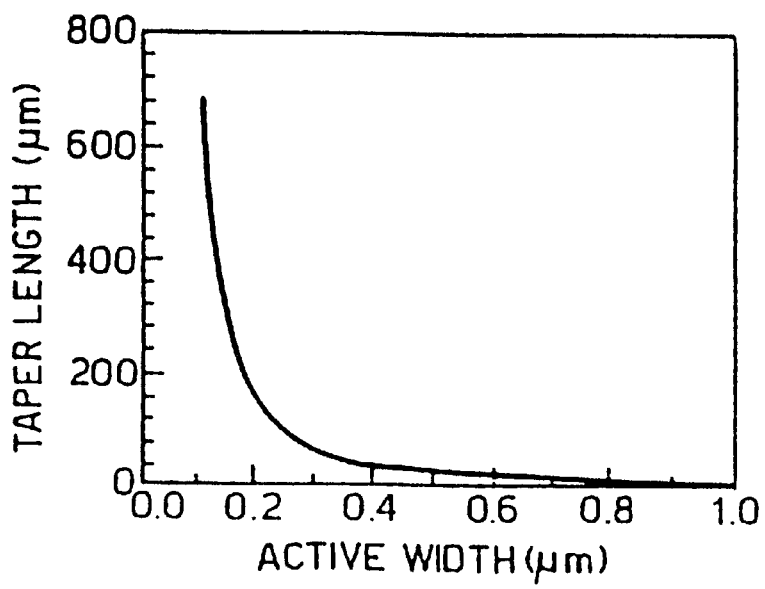
FIG. 15 is a graph showing the critical taper length according to Love's method for a 16 well active layer device having the passive waveguide shown in FIG. 13.

A 16 well MQW active region was initially modelled for the upper active guide structure. The taper length required was calculated using Love's method and the taper length was found to be virtually identical to that shown in FIG. 2. However the single pass loss at the truncation point was found to be much larger, (see FIG. 14), than previously calculated due to the greater mode expansion. These results indicated that the active width would need to be reduced to 0.1 μm before truncation if this loss was to be kept sufficiently low. This greatly increases the taper length required, (see FIG. 15), suggesting that a critical taper length of over 600 μm would be required, greatly increasing device length, and tightening the active width tolerance required.

To improve the active width tolerance, the effect of a reduced active thickness was investigated, both theoretically and experimentally. An eight well strained MQW active region was chosen, since this structure is known to have good high temperature performance. See, for example Nobuhara H, Tanaka K, Yamamoto T, Machida T, Fujii T and Wakao K, "High-Temperature Operation Of InGaAs/InGaAsP Compressive-Strained QW Lasers With Low Threshold Currents", IEEE Photon. Tech. Lett., 1993, 5, (9), pp. 961–962, or Namegaya T, Kasukawa A, Iwai N and Kikuta T, "High Temperature Operation Of 1.3 μm GaInAsP/InP GRINSCH Strained-Layer Quantum Well Lasers", Electron. Lett., 1993, 29, (4), pp. 392–393.

The planar design used in the 8 well device is similar to that of the 16 well device. The planar is epitaxially grown on an n doped InP substrate by atmospheric pressure MOVPE and consists of; a 3 μm thick n doped InP buffer layer, a 0.16 μm thick n doped 1.1 μm wavelength quaternary guide, a 0.2 μm thick p doped InP cap. The MQW active layer consists of 8 wells of $In_{0.84}Ga_{0.16}As_{0.68}P_{0.32}$, which have a mismatch of +1% with respect to InP, and a nominal well thickness of 70 Å. The 140 Å thick 1.3 μm wavelength quaternary barriers are stained −0.5% relative to the substrate to compensate for the strain in the wells. The MQW active layer has an average refractive index of 3.447 at 1.55 μm. The MQW structure is surrounded by 100 Å thick SCH with the same composition and strain as the barriers. The device is then fabricated into BH lasers as described above.

A comparison of the threshold current at 20° C. for unstrained 16 well and strained 8 well low threshold devices are shown in table 3. As can be seen the 8 well devices have room temperature threshold currents of less than half that of the 16 well devices. The threshold current of the 8 well devices remains low at elevated temperatures, with values of ≈1.5 mA being observed for devices with 60 μm and 180 μm tapers at 80° C., FIG. 2, compared to ≈13 mA for untapered 300 μm long devices.

TABLE 3

| | Taper length | | | | |
|---|---|---|---|---|---|
| Device Type | None | 60 μm | 180 μm | 400 μm | 800 μm |
| Unstrained 16 well MQW | 8.5 mA | 11.5 mA | 12.6 mA | 14.0 mA | 20.7 mA |
| Strained 8 well MQW | 4.2 mA | 4.8 mA | 4.9 mA | 5.8 mA | 7.0 mA |

Comparison of unstrained 16 well and strained 8 well MQW laser threshold currents at 20° C. vs. taper length for devices with a 300 μm long untapered active section.

Figure 16:
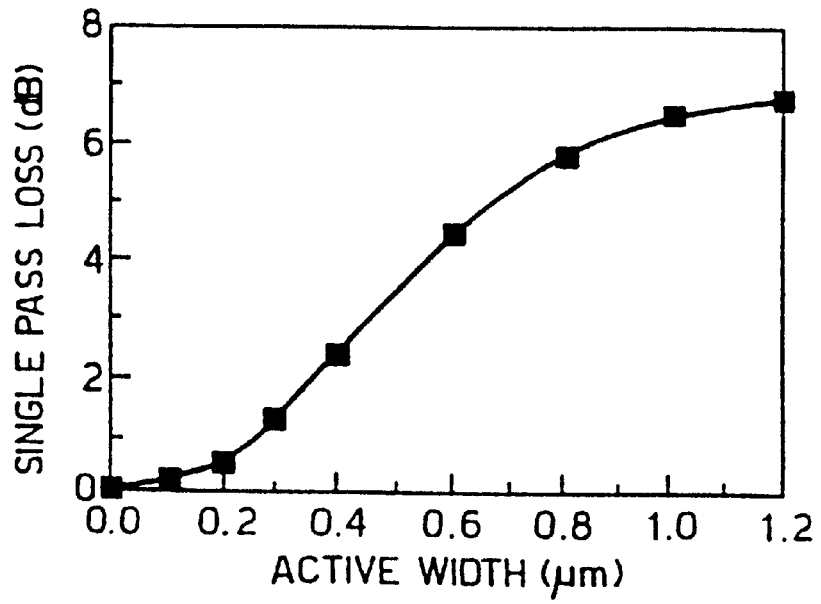
FIG. 16 is a graph showing truncation loss against active waveguide width for an 8 well strained active layer device having the passive waveguide shown in FIG. 13.
Figure 17:
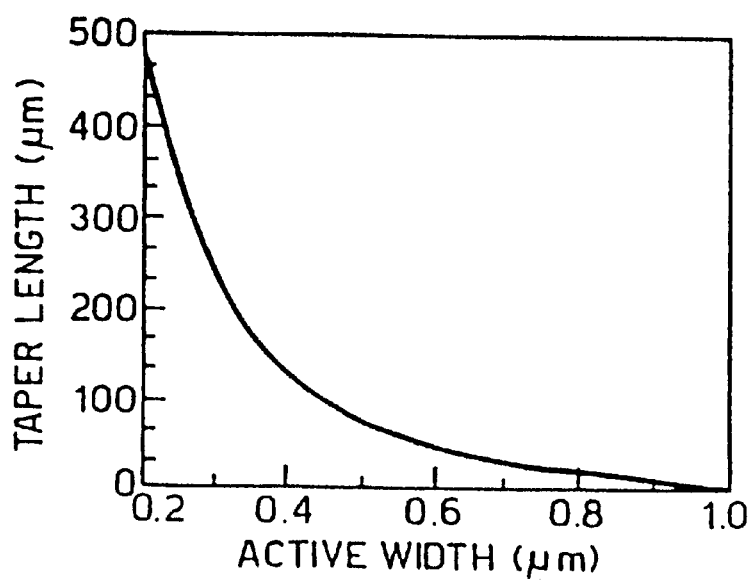
FIG. 17 shows the critical taper length by Love's method for an 8 well strained active layer device having the passive waveguide shown in FIG. 13.
Figure 21:
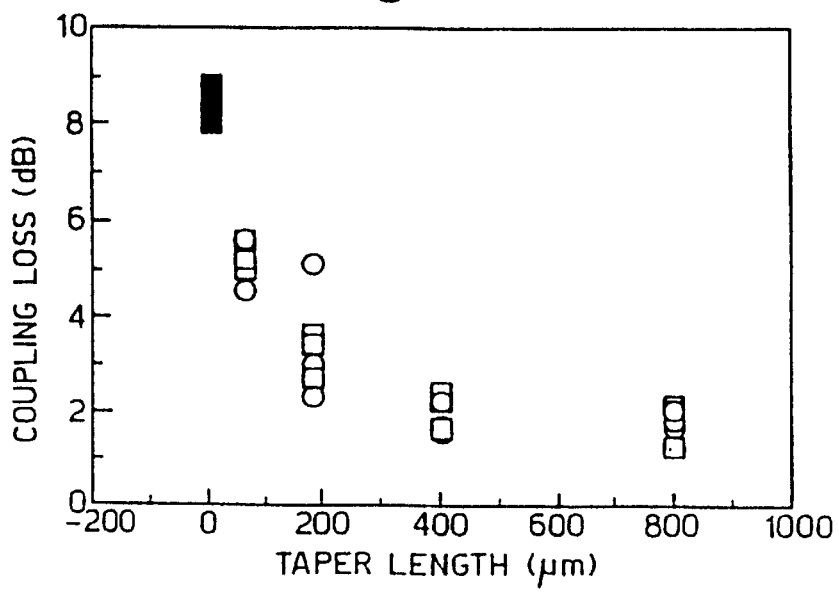
FIG. 21 is a graph of coupling loss measured to 10 $\mu$m core cleaved fibre as a function of taper length measured at 50 mA drive current and 20° C. for large spot size laser having 8 well MQW active region, and 5 $\mu$m wide, 800 Å thick passive region.
Figure 19:
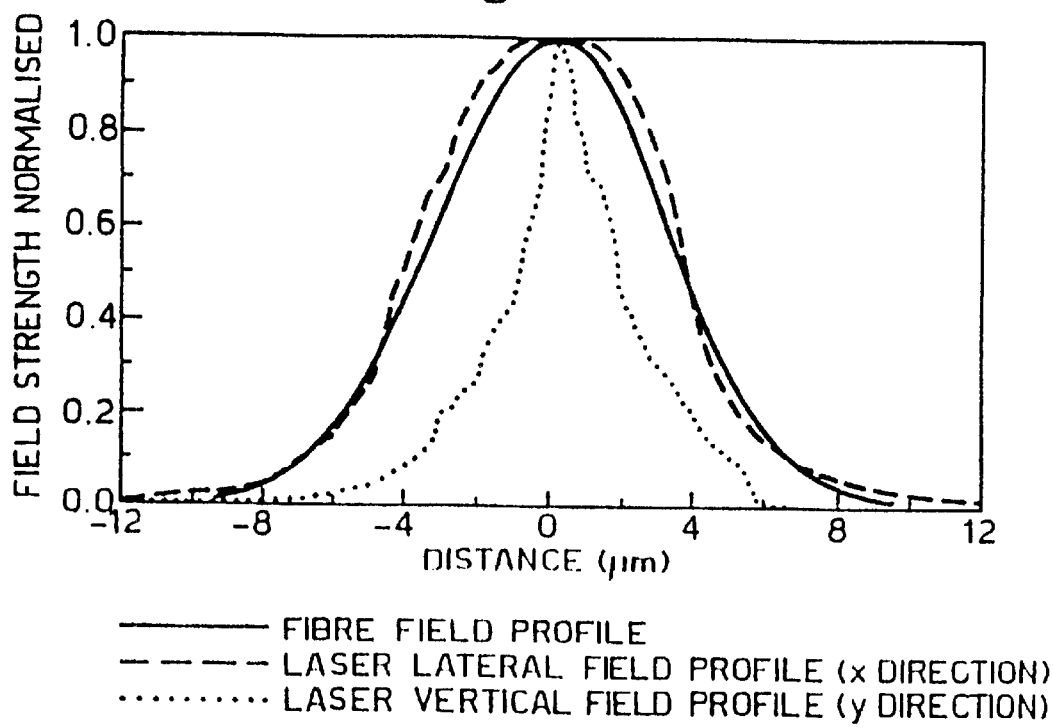
FIG. 19 is a graph of calculated field profiles for 10$\mu$m core single mode fibre and a large spot laser having a 7 $\mu$m wide, 700 Å thick passive region.
Figure 20:
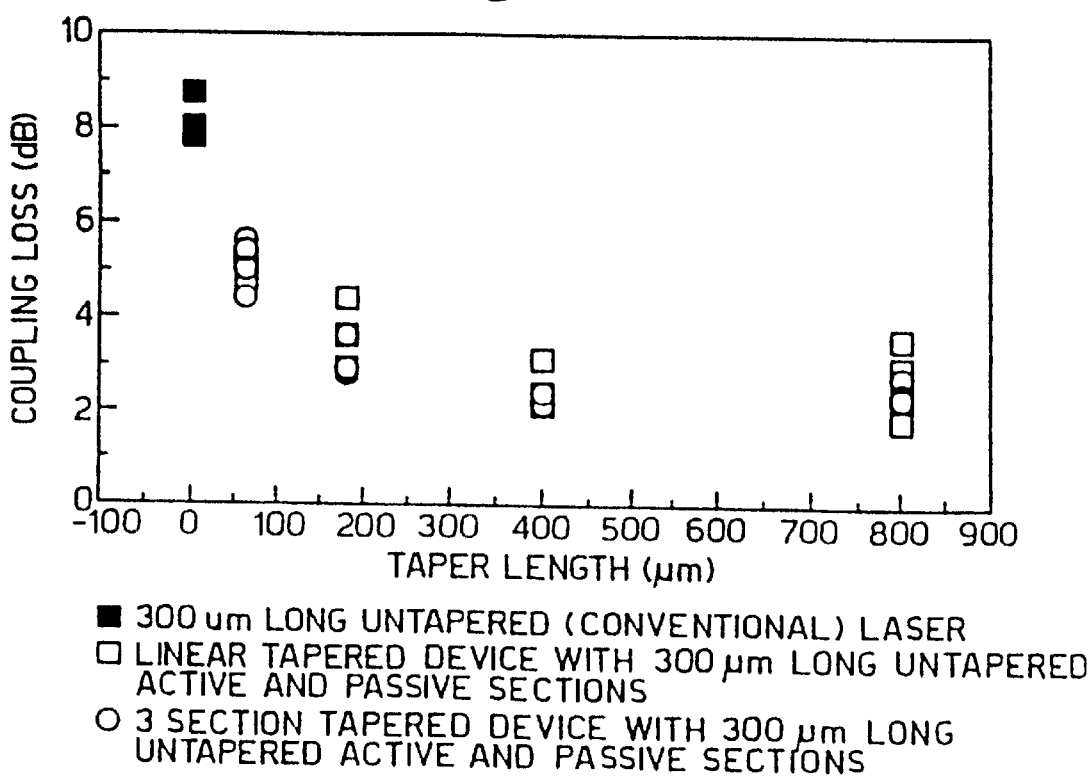
FIG. 20 is a graph of coupling loss measured to 10 $\mu$m core cleaved fibre as a function of taper length measured at 50 mA drive current and 20° C., for a large spot size laser having an 8 well MQW active region and 7 $\mu$m wide, 700 Å thick passive region.

The active layer thickness is thus reduced from ≈0.27 μm for the 16 well to ≈0.17 μm for the 8 well active layer. These changes in waveguide design reduce the theoretically calculated truncation loss as a function of active width, (see FIG. 16), allowing the truncation width to be increased to 0.2 μm. However the taper length as a function of active width was also increased, (see FIG. 17), due to the smaller index difference between the guided and substrate modes. The net effect of this was a small decrease in taper length to ≈500 μm for the device. This device was calculated to have a lateral e-field modal size equal to that of 10 μm core, cleaved fibre, see FIG. 19. The mode size was calculated using a variable grid finite difference method. The calculated overlap between the calculated fields suggests a coupling loss of 0.7 dB should be obtained. The fabricated device was measured to have a minimum coupling loss, for the 800 μm taper device, of 1.8 dB, see FIG. 20. The higher measured coupling loss is due to the model underestimating the lateral mode size of the device. While this resulted in lower coupling efficiency it gave larger alignment tolerances. The lateral 3 dB alignment tolerance measured experimentally was ±5.5 μm rather than the 3.5 μm one would expect theoretically. It can be seen that this increase in alignment tolerance is of benefit because it further increases the ease of passive alignment. The fact that the mode is oversized is confirmed by the measured farfield FWHM for this device of 5.5° by 10° (10 μm cleaved fibre has a FWHM of ≈7.5° at 1.55 μm wavelength). In order to slightly reduce this oversized mode, a device in which the passive guide has been strengthened slightly has been fabricated. This device has a passive region which is 5 μm wide by 800 Å thick, while still retaining an 8 well MQW active region. As can be seen from FIG. 21, this has resulted in a further reduction of coupling loss to ≈1.2 db, for the 800 μm taper device.

What is claimed is:

1. A method for making a semiconductor optical device, the method comprising the steps of:

(a) epitaxially growing a planar wafer on a substrate, the wafer comprising an optically active region above an optically passive region;

(b) defining a first mesa comprising the active region;

(c) forming a mask on the first mesa, the width of the mask being less than the width of said first mesa, the mask width varying along the length of the mask; and (d) defining a second mesa, of substantially the same width as the first mesa, which second mesa comprises the passive region, and redefining the first mesa to correspond to the mask.

2. A method for making a semiconductor optical device as in claim 1 further comprising the steps of:

(e) reducing the width of the active region by etching with a selective etchant; and (f) performing a heat treatment sufficient to cause material transport.

3. A method for making a semiconductor optical device as in claim 1 further comprising the steps of:

(g) performing a first stage overgrowth to form optical and electrical confinement layers along the sides of said first and second mesas; and (h) performing a second stage overgrowth over the first and second mesas.

4. A method for making a semiconductor optical device as in claim 1 wherein step a is carried out using metal organic vapour phase epitaxy.

5. A method for making a semiconductor optical device as in claim 2 further comprising the steps of:

(g) performing a first stage overgrowth to form optical and electrical confinement layers along the sides of said first and second mesas; and (h) performing a second stage overgrowth over the first and second mesas.

6. A method for making a semiconductor optical device as in claim 2 wherein step a is carried out using metal organic vapour phase epitaxy.

7. A method for making a semiconductor optical device as in claim 3 wherein at least one of steps g and h is carried out using metal organic vapour phase epitaxy.

* * * * *